United States Patent [19]
Koinuma et al.

[11] Patent Number: 5,549,780
[45] Date of Patent: * Aug. 27, 1996

[54] METHOD FOR PLASMA PROCESSING AND APPARATUS FOR PLASMA PROCESSING

[75] Inventors: Hideomi Koinuma, Tokyo; Tadashi Shiraishi, Kanagawa; Tohru Inoue, Niigaka; Kiyoto Inomata, Kanagawa; Shigenori Hayashi, Kanagawa; Akiharu Miyanaga, Kanagawa; Shunpei Yamazaki, Tokyo, all of Japan

[73] Assignee: Semiconductor Energy Laboratory Co., Ltd., Japan

[*] Notice: The portion of the term of this patent subsequent to Mar. 30, 2010, has been disclaimed.

[21] Appl. No.: 35,921

[22] Filed: Mar. 22, 1993

Related U.S. Application Data

[63] Continuation-in-part of Ser. No. 777,708, Oct. 21, 1991, Pat. No. 5,198,724, and Ser. No. 813,758, Dec. 30, 1991, Pat. No. 5,221,427.

[30] Foreign Application Priority Data

Mar. 24, 1992 [JP] Japan ................... 4-097269
Mar. 24, 1992 [JP] Japan ................... 4-097270
Mar. 24, 1992 [JP] Japan ................... 4-097271

[51] Int. Cl.$^6$ .................. C23F 1/02; C23C 16/00
[52] U.S. Cl. ..................... 156/345; 118/723 E
[58] Field of Search ................. 156/643.1, 345, 156/DIG. 68; 315/111.21; 118/723 E, 723 R; 204/298.39, 298.34

[56] References Cited

U.S. PATENT DOCUMENTS

| | | | |
|---|---|---|---|
| 4,297,162 | 10/1981 | Mundt | 156/643 |
| 4,979,467 | 12/1990 | Kamaji | 118/723 E |
| 5,198,724 | 3/1993 | Koinuma | 315/111.21 |
| 5,221,427 | 6/1993 | Koinuma | 156/643 |
| 5,314,540 | 5/1994 | Nakamura | 118/723 |

OTHER PUBLICATIONS

CRC, Handbook of Chemistry and Physics 63rd Ed. 1982–1983, CRC Press p. E-56.

Primary Examiner—R. Bruce Breneman
Assistant Examiner—Jon Y. Chang
Attorney, Agent, or Firm—Sixbey, Friedman, Leedom & Ferguson; Gerald J. Ferguson, Jr.; Karlton C. Butts

[57] ABSTRACT

An apparatus for generating plasma of helium mainly-contained gas added with halogen element using high-frequency energy which is applied between concentrically-arranged electrodes to conduct an etching treatment on a substrate with the thus-generated plasma, is equipped with a grounded electrode on the surface of the substrate, the grounded electrode serving to prevent electrification or charging of the substrate. A cylindrical insulator is provided between the electrodes so as to be contacted with the outside electrode, and a voltage applied between the central electrode and the cylindrical insulator is heightened by reducing the thickness of the cylindrical insulator or increasing the dielectric constant of the cylindrical insulator, so that low-temperature plasma is generated under atmospheric pressure using argon mainly-contained gas in a reaction space. Further, in a plasma generating apparatus for generating plasma with a pair of parallel electrodes, an insulator having high dielectric constant is provided in close contact with one of the electrodes, and gas mainly containing rare gas such as helium, argon or the like is supplied into the discharge space between the pair of parallel electrodes while the flow amount of the gas is controlled by a flow-amount controller, thereby inducing the gas to plasma under atmospheric pressure, and generating a sheet-shaped plasma.

15 Claims, 9 Drawing Sheets

METHOD FOR PLASMA PROCESSING AND APPARATUS FOR PLASMA PROCESSING

This application is a continuation-in-part of application Ser. No. 777,708, filed Oct. 21, 1991, now U.S. Pat. No. 5,198,724 entitled *Plasma Processing Method and Plasma Generating Device* and application Ser. No. 813,758, filed Dec. 30, 1991, now U.S. Pat. No. 5,221,427 entitled *Plasma Generating Device and Method of Plasma Processing*.

BACKGROUND OF THE INVENTION

1. Field of the Invention

This invention relates to the improvement of an etching treatment which is performed without heating a substrate using a plasma-treatment apparatus capable of stably inducing discharge under atmospheric pressure and obtaining low-temperature discharge plasma. Further, this invention relates to a plasma-treatment method in which kinds of gas usable for the plasma-treatment can be multiplied to perform discharge under various experimental conditions, and also to a plasma-treatment method in which the etching treatment can be stably performed irrespective of insulation property/resistant value of a substrate. Still further, this invention relates to a plasma-treatment apparatus capable of stably obtaining sheet-shaped (planar) and low-temperature discharge plasma under atmospheric pressure.

2. Description of Related Art

An atmospheric-pressure state serves as an insulator under low electric field, however, application of high electric field such as direct current, alternating current and impulse causes the insulator to be broken down, so that current flows through the insulator (self-maintaining discharge). The self-maintaining discharge is classified into a corona discharge, glow discharge and arc discharge. When uniform electric field is applied, all paths are broken down (all-path breakdown is induced) immediately after the atmospheric-pressure state is shifted to the self-maintaining discharge, and thus the self-maintaining discharge proceeds to the glow discharge or the arc discharge. On the other hand, when ununiform electric field is applied, breakdown is first locally induced at positions to which higher electric field is applied, and the corona discharge is induced at these portions. Thereafter, as the electric field is intensified, the all-line breakdown is induced. In an atmospheric-pressure air, the self-maintaining discharge is frequently directly shifted to the arc discharge without passing through the glow discharge when the state suffers the all-line breakdown. The reason for this would be considered as follows. The arc discharge is based on thermionic emission (existence of cathode spot) due to electrode heating which is caused by incident ions. The number of incident ions to the electrode under high pressure is higher than that under low pressure, and thus the electrode is heated for a very short time to induce thermionic emission. For current below 2A, the occurrence of the glow discharge has been also known. However, the glow discharge has a problem that controllability thereof is low. In general, the arc discharge has been dominantly applied to a welding process, a cutting process, etc.

The arc discharge has been used to melt or fuse an object to be processed by utilizing its high electrode temperature and its high positive column temperature (gas temperature). However, use of the arc discharge causes a problem that no processing for the object can be carried out without heating the object, for example, at a room temperature because the temperature of the object to be processed is increased to 2000 to 6000K in the arc discharge.

In order to enable fundamental treatment, processing, etc. at a room temperature, an attempt to stably induce the glow discharge under atmospheric pressure has been made (by S. Kanazawa, et. al., J. Phys. D; Appl. Phys. 21 (1988) pp 838–840). The following features have been known as necessary conditions to stably perform the glow discharge under the atmospheric pressure: (1) a discharge space is filled with He, (2) an insulator is inserted between electrodes (in a discharge path), (3) at least one of the electrodes is shaped in a needle or brush form, and (4) frequency of applied electric field is above 3 kHz. The insulator is used to prevent the discharge from being shifted to the arc discharge, the setting of the frequency of the applied electric field above 3 kHz is used to make current flow through the insulator, and the needle or brush shape of the electrode is adopted to make the electric field ununiform so that the discharge is liable to be induced. Various treatments such as an etching treatment for etching the surface of organic material such as polyimide, etc., or the surface of inorganic material such as silicon, etc., have been attempted with the above method. However, any one of these methods requires a process for reducing the pressure of an reaction space to vacuum once and then filling gas such as helium into the space although they are carried out under atmospheric pressure. In addition, the treatment for a substrate is uniformly carried out over the surface of the substrate, and thus it is impossible to locally and selectively treat a minute area of the surface.

In order to overcome the above disadvantage, the inventor of this application invented a plasma generating apparatus in which stable low-temperature plasma is formed in an atmospheric-pressure state of open system using no process of reducing the pressure of the system to vacuum once, and the plasma thus formed is enclosed in a minute area to subject the minute area to a processing, a surface treatment and an etching, and an etching method using the apparatus (as disclosed in Japanese Patent Application No. 2-286883).

In the plasma generating apparatus and the etching method as described above, electrodes comprising conductors which are formed of metal or the like are concentrically and cylindrically arranged, and a cylindrical insulator is inserted into a gap between the electrodes so as to be concentrical with the electrodes and in contact with the outside electrode. A helium mainly-contained gas is kept to flow through a gap between the insulator and the center electrode under atmospheric pressure, and alternating current is supplied between the electrodes to ionize the helium mainly-contained gas, whereby plasma is generated in the gap between the insulator and the center electrode. An etching gas is introduced into the plasma to perform an etching treatment.

According to this method, low-temperature plasma can be obtained with a simple experimental apparatus, and an etching processing can be carried out even for organic material having no heat resistance using halogen compound gas as etching gas. In addition, the temperature of plasma is confirmed to be below 100° C. with a thermocouple when an applied alternating electric field (13.56 MHz) is about 100 W.

The plasma generating apparatus under atmospheric-pressure condition in an open system has been researched and developed by the inventor of this application as described above, so that practical use of low-temperature plasma under atmospheric pressure would be expectable. However, this method still has various problems to be solved. One of the problems is a problem of a plasma discharge area, that is, an area to be treated by plasma (plasma-treatment area) which is exposed to outside air.

The low-temperature plasma discharge modes under atmospheric-pressure condition, containing the above invention, which have been conventionally proposed are mainly classified into the following two types.

1. Types to which a parallel and planar type discharge apparatus is applied

Some apparatuses were proposed in the past. The basic construction is as follows. A discharge space is formed by two parallel electrodes one of which is provided with a dielectric plate, and these electrodes are accommodated in a discharge chamber which is kept under atmospheric-pressure state by plasma source gas to perform an atmospheric-pressure discharge. A sample to be subjected to a film formation treatment or an etching processing is mounted on the electrode. The plasma exists at only a space between the opposed electrodes.

2. Types using needle-shaped/beam-shaped plasma

Representative one of these types is the apparatus as described above, which was invented by the inventor of this application. That is, a needle-shaped electrode is disposed at the center of the void of the cylindrically-arranged electrodes, and the discharge is carried out under atmospheric-pressure state. A beam-shaped plasma is obtained not only at the void of the electrodes, but also by gas flow.

The above two apparatuses are unpracticable from the viewpoint of the discharge area. In the conventional parallel and planar type, the discharge is carried out in a non-open system inside of a chamber, and thus a chamber and an evacuation device are required. In addition, it is unpractical from the viewpoint of the application of the plasma to the film formation/processing, etc. in a completely-open system which has been conventionally attempted by the inventor of this application. Further, the accommodation of the apparatus with a sample into the chamber deteriorates flexibility even though the discharge area is large.

It was proposed in the past that the film formation/processing in an open system was carried out using a plasma generating apparatus for generating a needle-shaped/beam-shaped plasma. In this method, the needle-shaped/beam-shaped plasma generating apparatuses were arranged in series to obtain a discharge state where an approximately sheet-shaped plasma is obtained. However, in this method, radical density is extremely different between the central portion and the outside portion in the needle-shaped/beam-shaped plasma, and this difference appears as fluctuation of radical density in a sheet in accordance with a position of the electrode. Therefore, an uniform sheet-shaped plasma has not been hitherto obtainable under atmospheric-pressure state in an open system.

In addition, the plasma under atmospheric pressure has high collision possibility between particles because of the atmospheric pressure (that is, mean free path is short), so that the possibility of electron-ion recombination in a space becomes high. As a result, the plasma is not spatially broadened, and it is rapidly extinguished as the potential gradient is lowered, so that there occurs a problem that the number of radicals which arrive at a substrate is extremely reduced. In order to prevent this reduction, the substrate may be approached to the discharge area as nearly as possible. However, the radical density is greatly varied in accordance with slight variation of distance in the neighborhood of the discharge area, so that there occurs another problem that the controllability of the radical density is remarkably deteriorated.

The conventional etching treatment method using the glow discharge under atmospheric pressure has a problem that an object to be processed is charged when the object is formed of insulator. Charges to be supplied to the object mainly contain electrons, and thus the supply of the electrons to the object would be disturbed if the object is charged. Consequently, the number of the radicals to be supplied to the object together with the electrons is also reduced, and thus the etching efficiency has been lowered.

As described in the conventional method, the use of the helium mainly-contained gas is indispensable to generate low-temperature plasma under atmospheric pressure. For example, when gas such as argon is used in place of the above gas, electric power above 100 W must be supplied, and thus there occurs a trouble that the central electrode is melted in a long-term discharge operation.

The cause of such a phenomenon has not been hitherto elucidated. However, from the fact that the discharge could be performed with argon by increasing electric power as described above, it is considered that simple substance of argon gas can provide a coexistent state of low-temperature plasma and fine arc discharge, and the fine arc discharge induces a thermal obstruction to an apparatus.

As a countermeasure to such a thermal obstruction in the atmospheric-pressure discharge using argon gas, success of discharge by adding argon with ketone (acetone) was reported. However, in this reported method, it is impossible to perform discharge under atmosphere having no additive. That is, the discharge using only argon gas was not succeeded in this method.

SUMMARY OF THE INVENTION

This invention has an object to perform an etching treatment with high efficiency even for an insulating object to be processed when the etching treatment is carried out by glow discharge under atmospheric pressure.

This invention has another object to provide an apparatus for generating large-area sheet-shaped plasma under atmospheric pressure in an open system to enable film formation or etching processing at large area in the open system.

A method for plasma processing in accordance with the present invention comprises the step of:

processing a surface of a work piece by a plasma formed by applying an electromagnetic energy to a reactive gas, wherein said surface is provided with an electrode thereon in order to remove a charge from said surface.

The electrode is formed before said processing step. The reactive gas is maintained substantially at an atmospheric pressure.

According to this invention, in order to leak to the outside charges on the surface of an object (substrate) to be processed, an electrode is provided on the whole or a part of the surface of the object and the electrode is kept to a ground potential to successively leak electrons from plasma to the outside, so that the etching of the surface of the object can be carried out with plasma while the surface of a substrate is not charged and kept at an initial condition.

The electrode may be connected with a positive electrode of a direct current power source instead.

Further, according to this invention, the discharge can be stably induced under atmospheric pressure using helium mainly-contained gas which contains halogen element to thereby perform an etching treatment without subjecting the object to high temperature.

A method for plasma processing in accordance with the present invention comprises the steps of:

forming a conductor on a surface of a work piece by forming a conductive film thereon; and etching said surface by a plasma formed by applying an electromagnetic energy to a gas comprising a helium gas and a halogen element with a charge being removed from said surface by virtue of said conductor.

Still further, according to this invention, a conductive film is provided on the surface of the object to prevent electrification of the object to be processed, so that the etching efficiency is improved.

DETAILED DESCRIPTION OF PREFERRED EMBODIMENTS

Preferred embodiments according to this invention will be described hereunder with reference to the accompanying drawings.

Figure 1:
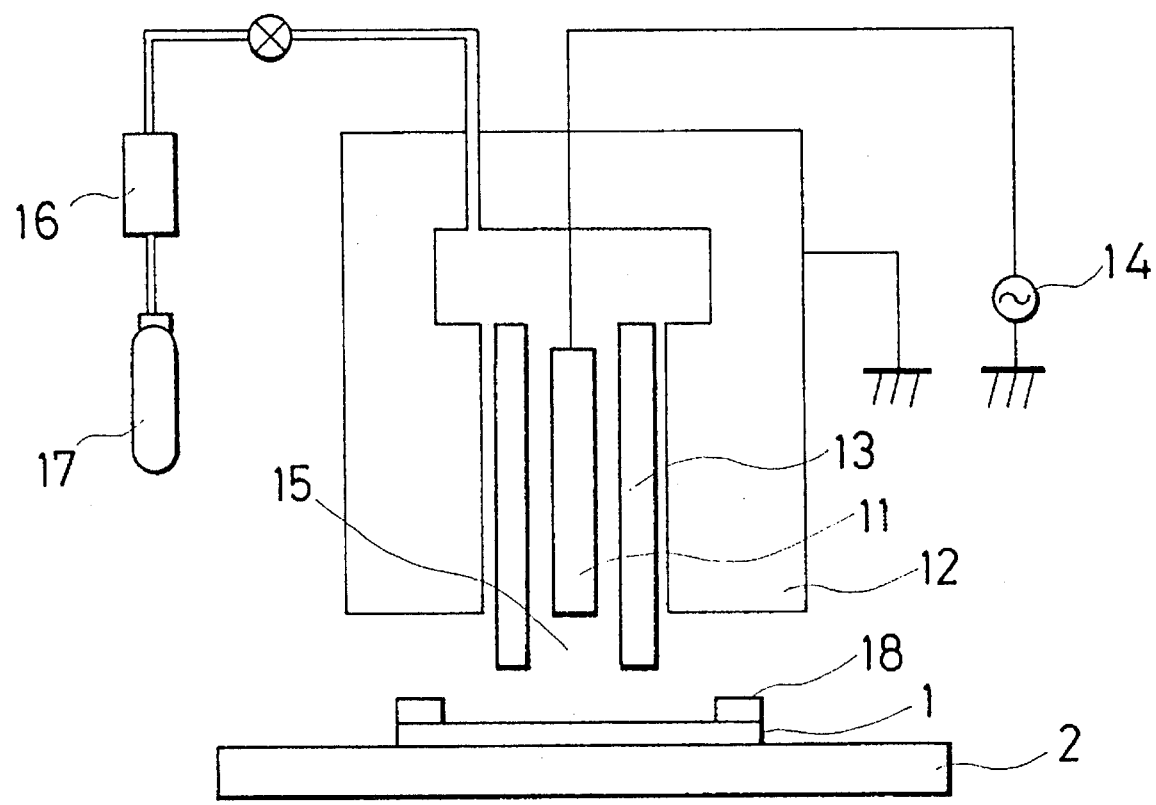
FIG. 1 is a schematic diagram of a plasma generating apparatus according to this invention.

FIG. 1 schematically shows a plasma processing apparatus (an etching apparatus) according to this invention. In FIG. 1, a cylindrical insulator 13 is disposed between a central conductor 11 serving as an inside electrode and an outside conductor 12 serving as an outside electrode concentrically provided, and an alternating electric field is applied as electromagnetic energy to each of the central conductor (the inside electrode) 11 and the outside conductor (the outside electrode) 12 from an alternating power source 14. A discharge place 15 is supplied with a helium mainly-contained gas from a bomb 17 through a flow-amount controller 16 while gas flow is continued. One bomb is illustrated in FIG. 1, however, a gas supply system may be provided to add halogen element to: helium if occasion demands. A substrate 1 to be etched is hold by a substrate holder 2 of paramagnetic material.

The substrate 1 is mounted on the substrate holder 2. An electrode thin film 18 serving as a ground electrode is accumulated (deposited) on the surface of the substrate 1. The electrode thin film 18 is formed of conductive material, and preferably formed by accumulating (depositing) high-conductive material such as gold, platinum, graphite or the like. Gold or platinum is preferably used for the electrode thin film 18 when the etching treatment is carried out with halogen-added helium, thereby protecting the electrode thin film 18 from being etched. As gold or platinum is metal which is hardly etched by halogen-group element, the surface of the insulating substrate which is an object to be etched is prohibited from being wholly coated with the metal. The accumulation (deposition) of the electrode thin film 18 is preferably carried out for edge portions of the substrate. The electrode thin film 18 is not necessarily formed of a deposited thin film, and for example, it may be formed by coating paste-like or adhesive tape-like high-conductive material (e.g., paste of graphite, gold or the like, adhesive conductive tape of graphite, copper or the like, etc.) concentrically at the edge portions of the substrate. The electrode thin film 18 is used as means for grounding a surface of a work piece to be etched.

Even though the electrode thin film 18 is not grounded, a certain degree of effect can be obtained. This is because the presence of a conductive substance on the surface of the object to be processed enables charges on the object to be leaked to some degree.

In order to solve the above problem, the inventor of this application has found out that by increasing the voltage to be applied between the electrodes, low-temperature plasma can be generated using discharge-difficult gas such as argon alone without addition of acetone (unlike the prior art) and with power supply of the same degree as that when helium gas is used. That is, by increasing the dielectric constant of the cylindrical insulator or reducing the thickness of the insulator while keeping the dielectric constant of the cylindrical insulator (material property) as it is, a starting voltage at the discharge space is increased without varying the supply power from the power source, and the stable discharge can be induced for gas which has been conventionally believed to be hardly discharged.

Figure 6:
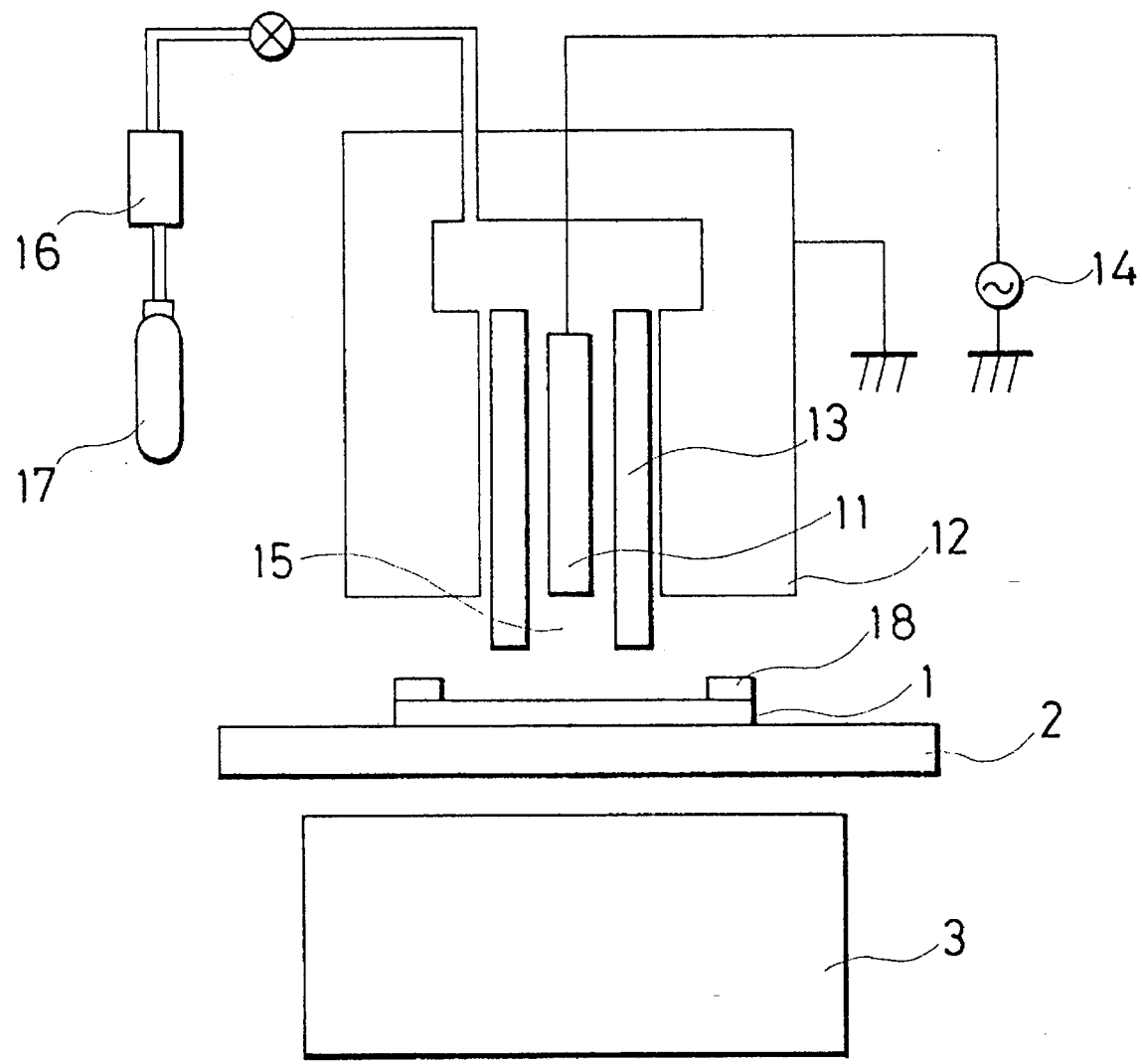
FIG. 6 is a schematic diagram of another plasma generating apparatus according to this invention.
Figure 8:
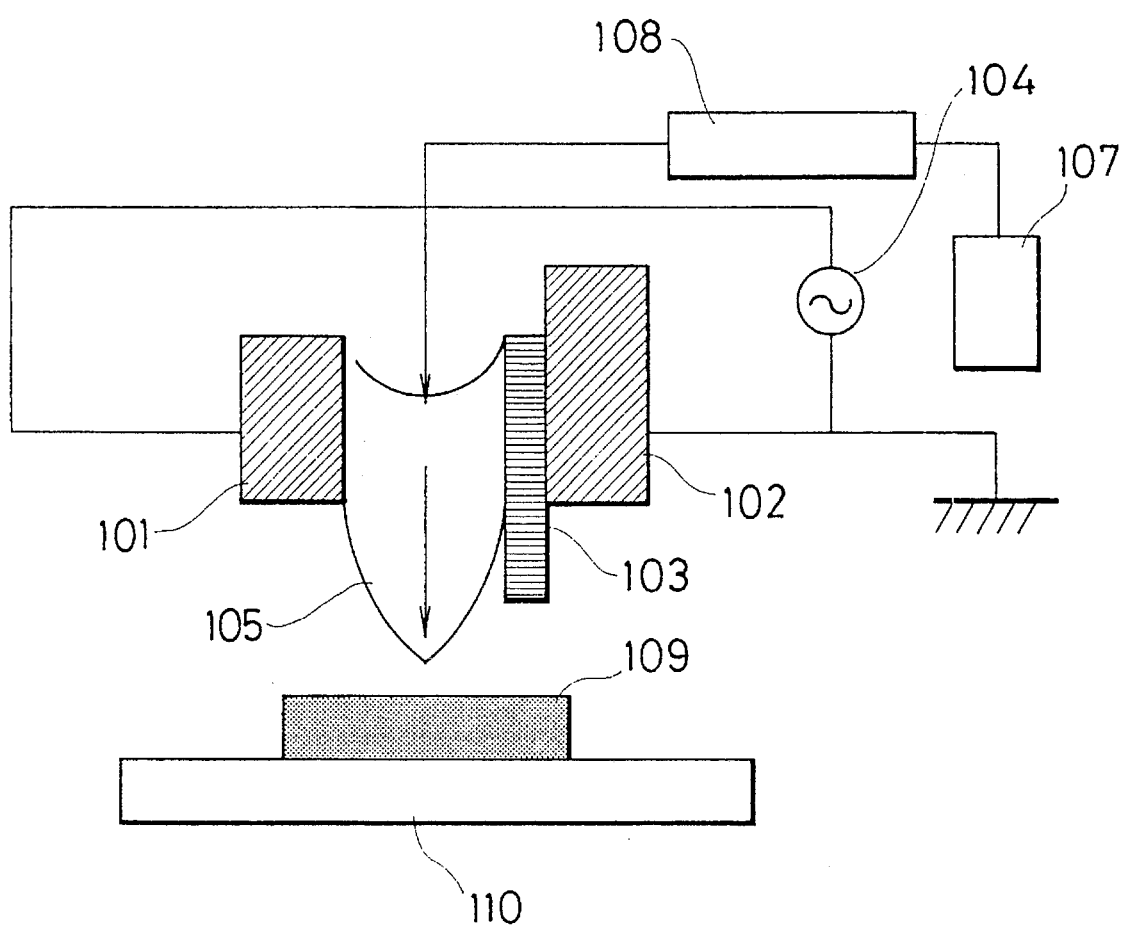
FIG. 8 is a schematic diagram of another plasma generating apparatus according to this invention.

FIG. 6 schematically shows a plasma generating apparatus which is used for this invention. In FIG. 8, a cylindrical insulator 13 is disposed between a central conductor 11 serving as an inside electrode and an outside conductor 12 serving as an outside electrode which are concentrically (coaxially) and cylindrically arranged with each other, and each of the central conductor 11 and the outside conductor 12 is supplied with an alternating electric field (13.58 MHz) from an alternating power source 14. A discharge space 15 is supplied with rare gas (argon) mainly-contained gas from a bomb 17 through a flow-amount controller 16 in a flowing state. In FIG. 6, one bomb is illustrated, however, many bombs may be provided in occasion demands.

Still further, according to this invention, gas is unidirectionally flowed between two adjacent electrode plates at an uniform speed, and allowed to discharge with high-frequency electric power applied between the electrodes, and active species in plasma which is generated by the discharge is pushed out to the outside of the electrodes by the gas flow, whereby a sheet-shaped (planar) plasma having uniform radical density is generated in a space adjacent to the electrode plates.

A plasma generating apparatus (plasma processing apparatus) according to this invention comprises a pair of electrode plates comprising conductors arranged so as to be confronted to each other in parallel, a planar insulator provided in a gap between the pair of electrode plates so as to be in contact with one of the electrodes, means for keeping helium or argon mainly-contained gas in a gap between the insulator and the other exposed electrode under atmospheric-pressure in an unidirectional flowing state (in one direction flowing state), means for applying an alternating electric field between the electrodes, and an opening for releasing the gas outside the apparatus in order to effect plasma processing outside the apparatus. The planar insulator preferably has a ratio (thickness thereof in unit of millimeter)/(relative dielectric constant thereof) of 1 or less.

FIG. 8 schematically shows the plasma generating apparatus according to this invention. In FIG. 8, an insulating plate 103 is provided between an electrode plate 101 and an outside frame 102 so as to be contacted with the outside frame 102, and an alternating electric field is applied from an alternating power source 104 to each of the electrode plate 101 and outside frame 102, each serving as an electrode. A discharge space 105 is supplied with gas mainly containing rare gas such as helium from a bomb 107 through a flow-amount controller 108 in a flowing state. The rare gas is maintained for example substantially at an atmospheric pressure. A reference numeral 109 represents a substrate which is used for a film formation or etching process, and a reference numeral 110 represents a substrate holder. However, the mount construction of the substrate is not limited to that of FIG. 8.

The central conductor 11 and the electrode plate 101 are preferably formed of metal having resistance against sputtering, such as tungsten, tantalum or the like because they are directly exposed to plasma. Since in the etching process gas containing halogen-group element having etching capability such as fluorine, chlorine, etc. is added to rare gas, the central conductor 111 or the electrode 101 is preferably formed of or coated thereon with gold, platinum or the like which is hardly etched by the halogen-group element. In addition, the outer diameter (OD) of the central conductor 11 and the inner diameter (ID) of the outside conductor 12 preferably satisfy the following inequality.

$$ID/OD \geqq 3$$

This inequality corresponds to a condition that an electric field between the central conductor 11 and the outside conductor 12 is ununiform (corona generating condition), and thus a condition for facilitating discharge start. The above condition is the most preferable condition, and thus even when the ratio of ID to OD is smaller than 3 and approaches to 1 (actually, the ratio is not equal to 1 because the cylindrical insulator 13 is inserted between the central conductor 11 and the outside conductor 12) for example, the glow discharge is induced without passing through the corona discharge. Therefore, this invention is not limited to the above condition (inequality).

Recesses and projections may be formed in a brush or comb form in about 1–2 mm depth on the surface of the electrode plate 101. The formation of these recesses and projections is adopted to make the electric field between the electrode plate 101 and the outside frame 102 ununiform, and facilitate the start of the discharge. The above condition is a preferable one, and this invention is not limited to the above condition. For example, a merely-planar plate may be used insofar as it can induce the discharge.

The cylindrical insulator 13 and the insulator 103 are provided to prevent the discharge induced between the electrodes from being shifted to the arc discharge, and may be formed of inorganic material such as quartz glass, alumina or the like, or organic material such as Teflon, polyimide, polyethylene, polyethylene terephthalate or the like.

These insulators are exposed to discharge, and thus the temperature thereof may be slightly increased. Therefore, quartz glass, alumina or the like which has high heat resistance is effectively used. As the dielectric constant of the insulator is increased, the voltage applied to the gap between the central conductor and the insulator is heightened, so that the discharge is more liable to start. Therefore, alumina, soda glass or the like is effective. The thickness of each of the cylindrical insulator 13 and the insulator 103 is varied in accordance with the relative dielectric constant thereof, and the discharge voltage exceeds the output voltage of a practical alternating power source when the gap between the central conductor and the insulator and the gap between the electrode plate 101 and the insulator are excessively large. Therefore, these gaps are suitably set to the following range. That is, the gaps between the insulator and the central electrode and between the insulator and the electrode plate 101 are below 5 mm, and preferably below 1 mm.

In this invention, the kinds of usable gas can be more multiplied by replacing the insulator with material having high dielectric constant or by extremely thinning the insulator. The relative dielectric constant and thickness of the insulator are set so as to satisfy the following relationship: thickness(mm)/relative dielectric constant is 1 or less, and more preferably 0.2 or less. A method for plasma processing in accordance with the present invention comprises the step of:

generating a plasma in an apparatus comprising a pair of electrodes, an insulator provided between said pair of electrodes and in contact with one of said electrodes by applying an alternating electric field between said pair of electrodes with a gas comprising a rare gas flowing between said insulator and the other one of said electrodes, wherein said insulator has a ratio (thickness thereof in unit of millimeter)/(relative dielectric constant thereof) of 1 or less.

The relative dielectric constant is preferably 8.0 or more. The thickness of the insulator is preferably 0.2 millimeter or shorter. Said gas comprising the rare gas is maintained for example substantially at an atmospheric pressure and ionized by the application of said alternating electric field. Said plasma is generated between said insulator and the other one of said electrodes.

The capacity of the gap between the electrodes, containing the cylindrical insulator, can be lowered by increasing the dielectric constant of the cylindrical insulator or reducing the thickness of the insulator. For example, when quartz glass is used as material for the cylindrical insulator, the capacity is about $7.38 \times 10^{-10}$(F/m), and when the material is replaced by alumina, the capacity is varied to about $1.702 \times 10^{-11}$(F/m). Further, when quartz glass is used as the material and the thickness is set to 0.3 mm, the capacity is about $9.5 \times 10^{-11}$(F/m). With this condition, a breakdown voltage which serves as a trigger for discharge can be increased.

Accordingly, as the dielectric constant of the insulator is increased or the thickness of the insulator is thinned, the voltage applied to the gap between the central conductor and the insulator is increased, and thus the discharge is more liable to start. Therefore, in comparison with a case where low-dielectric constant material such as quartz glass (relative dielectric constant: 3.8) is used, higher voltage can be applied to raw material in case of alumina (relative constant: 8.5) or soda glass (relative dielectric constant: 7.5) is used, and thus the atmospheric-pressure discharge can be carried out for raw material which requires a high voltage to start the discharge.

The thickness of the cylindrical insulator is determined on the basis of the kind of the used raw gas and the relative dielectric constant of the insulator. That is, when a discharge-difficult gas is subjected to a discharging operation using the low-dielectric constant material such as quartz glass (relative dielectric constant: 3.8), alteration of the dielectric constant is compensated to some extent by reducing the thickness of the insulator. As the gap between the central conductor and the insulator is excessively increased, the discharge voltage induced on the surface of the dielectric material exceeds the output voltage of the alternating power source. Therefore, the gap between the insulator and the central electrode is set below 5 mm, preferably below 1 mm, and thickness (mm)/relative dielectric constant is below 1, preferably below 0.2. This means that the cylindrical insulator preferably has a thin thickness and a large relative dielectric constant. Of course, it is needless to say that the thickness must not be reduced to such an extent that the breakdown is induced.

The lower limit of frequency of the alternating power source is determined by a capacitive susceptance which is generated by the insulator inserted into a discharge path. That is, capacity C per unit length is represented by a series composite capacity of a gap capacitance Cg between the central conductor and the insulator and an insulator capacitance Ci, $Cg = 2\pi\epsilon_o/\log(b/a)$, $Ci = 2\pi\epsilon/\log(c/b)$ Here, a represents radius of the central conductor, b represents inner diameter of the insulator, c represents inner diameter of outside electrode, $\epsilon$ represents dielectric constant of insulator, and $\epsilon_o$ represents dielectric constant of vacuum. The electric field which is applied between the concentrically and cylindrically arranged electrodes is divided in ratio of Cg and Ci. It is experimentally proved that the discharge is stably carried out if the susceptance value $\omega C$ by the insulator is above $10^{-6}$ [S]. Accordingly, setting a, b and c to 0.5 mm, 0.85 mm and 1.25 mm, setting the length of the coaxial cylinder to 13 mm, and using quartz for the insulator (relative dielectric constant: 3.8), Ci=13 pF, and thus the frequency above about 12 kHz may be used. As described above, the increase of the dielectric constant or the reduction of the thickness of the insulator causes the increase of the breakdown voltage, and thus causes the increase of the discharge-maintaining frequency. In this invention, the frequency of 13.56 MHz which is generally used as an industrial frequency is used, however, the discharge can be maintained with no obstruction.

In the plasma generating apparatus as shown in FIG. 8, the frequency of the high-frequency electric power which is applied between the electrode plate and the insulator plate can be also widely set. In this invention, 13.56 MHz, generally used as the industrial frequency, is used. However, since the composition/density of the plasma is varied in accordance with the frequency, a suitable frequency may be selected in accordance with its object.

The gas inserted into the apparatus will be hereunder described.

In the conventional atmospheric-pressure discharge apparatuses, containing the invention made in the past by the inventor, the rare gas mainly-contained gas has been required to contain helium of 70% or more. In the apparatus of this invention, the discharge with argon can be induced with an electric power which is slightly higher than that in the case of helium, that is, 50 W plus several W. Further, when, like the conventional method, the thickness of the cylindrical dielectric substance, that is, the value (c–b) is 0.2 mm or the value of the relative dielectric constant is low, the helium mainly-contained gas which is supplied to the discharge space 15 is required to contain helium of 70% or more. On the other hand, in this invention, by increasing the value of the relative dielectric constant of the cylindrical dielectric material or reducing the thickness of the cylindrical dielectric material, the discharge can be induced using rare gas other than helium (particularly using argon gas) without helium or without addition of acetone which has been adopted in the prior art. In addition to rare gas such as He, Ne, Ar, Kr, Xe, etc., gas containing halogen-group such as $CF_4$, $CCl_4$, $NF_3$ or the like may be used as an additive gas. When halogen-group gas is used, an etching processing for a silicon substrate, etc. can be performed. When $CF_4$ is used as the additive gas, it is experimentally proved that no discharge would be induced if the density of $CF_4$ is above 4%. Further, when an object to be etched is an organic substrate material, oxygen may be used as the additive gas. If hydrocarbon-group gas such as $CH_4$, $C_2H_4$ or the like is added, a carbon film could be deposited on a substrate surface. If $SiH_4$ or the like is used, a silicon film could be deposited on a substrate surface. However, in this case, risk is higher because of the film formation in an open state.

For the supply of the reaction gas, the flow-amount/flow-speed is desirably as uniform as possible in the discharge space 105 of the plasma generating apparatus. The flow-speed/flow-amount is one of factors which determine the length/uniformity of the sheet-shaped plasma, and the radical travel distance can be controlled by controlling the flow amount of the supplied gas. In the plasma generating apparatus of this invention, a groove extending to the discharge space 105 is formed inside of the apparatus to promote the uniformity of the supplied gas. When the sectional area of the gap between the electrode and the insulator is set to 8 mm$^2$, the flow-speed is about 40 mm/sec for gas supply of 200 sccm. If the supply gas amount is increased, the flow speed is increased in proportion to the increase of the supply gas amount, and the radical travel distance is lengthened.

In addition to the above method that the reaction gas is mixed with the rare gas and the mixture is introduced into the discharge space, there is another method that, for example when helium is used, helium radicals are fed to a reaction-required area such as the surface of a substrate through gas flow by using long life-time of metastable excited helium atom, and a reaction gas (halogen-group reaction gas for the etching process) is separately supplied to the area by an external nozzle or the like. In this case, no ion reaches the area to be reacted, and only the radicals can be supplied thereto, so that no current flows through an object to be reacted. Therefore, a living body (human body/or animal or plant/microorganism) may be selected as the object to be reacted. That is, a tooth or nail may be cut by radicals of etching gas which is supplied if occasion demands.

In the plasma generating apparatuses according to this invention as shown in FIGS. 1 and 6, the radical travel distance can be controlled by controlling the supply gas flow amount. For example, when the inner diameter of the insulator is set to 0.85 mm, the flow speed is about 500 mm/sec for gas supply of 70 sccm. As the supply gas flow amount is increased, the flow speed is increased in proportion thereto, and the radical travel distance is also increased.

In FIG. 8, a reference numeral i represents a substrate to be etched, a reference numeral 2 represents a substrate holder, a reference numeral 3 represents a magnet for improving the etching efficiency with magnetic field, and a reference numeral 18 represents a grounded electrode which is used to prevent the substrate 1 from being charged. The electrode 18 is not indispensable for this invention.

The helium mainly-contained gas which is supplied to the discharge space 15 may contain 70% or more helium. In this case, rare gas such as Ne, Ar, Kr, Xe or the like may be used as additive gas. $CF_4$, $CCl_4$, $NF_3$ or the like may be used as halogen compound gas containing halogen element which is necessary for the etching process. When $CF_4$ is used, it is experimentally proved that no discharge is induced for $CF_4$ density above 4%. However, when $CF_4$ density is below 0.5%, the etching treatment can be little carried out. If hydrocarbon such as $CH_4$, $C_2H_4$ or the like is added, a carbon film can be formed. Further, if $SiH_4$ or the like is used, a silicon film can be also formed, however, risk is high because the film formation is carried out in an open state.

An object to be etched, that is, an object to be processed is not only a substrate at an area other than a discharge area, but also an electrode itself in a discharge space. In this case, a needle-shaped substance having very sharp tip can be formed.

The following description pertains to the construction of embodiments of the plasma generating apparatus which were designed for an experiment and the construction of a comparative example of a conventional plasma generating apparatus to clarify the difference in effect between this invention and the prior art.

[Embodiment 1]

Figure 2:
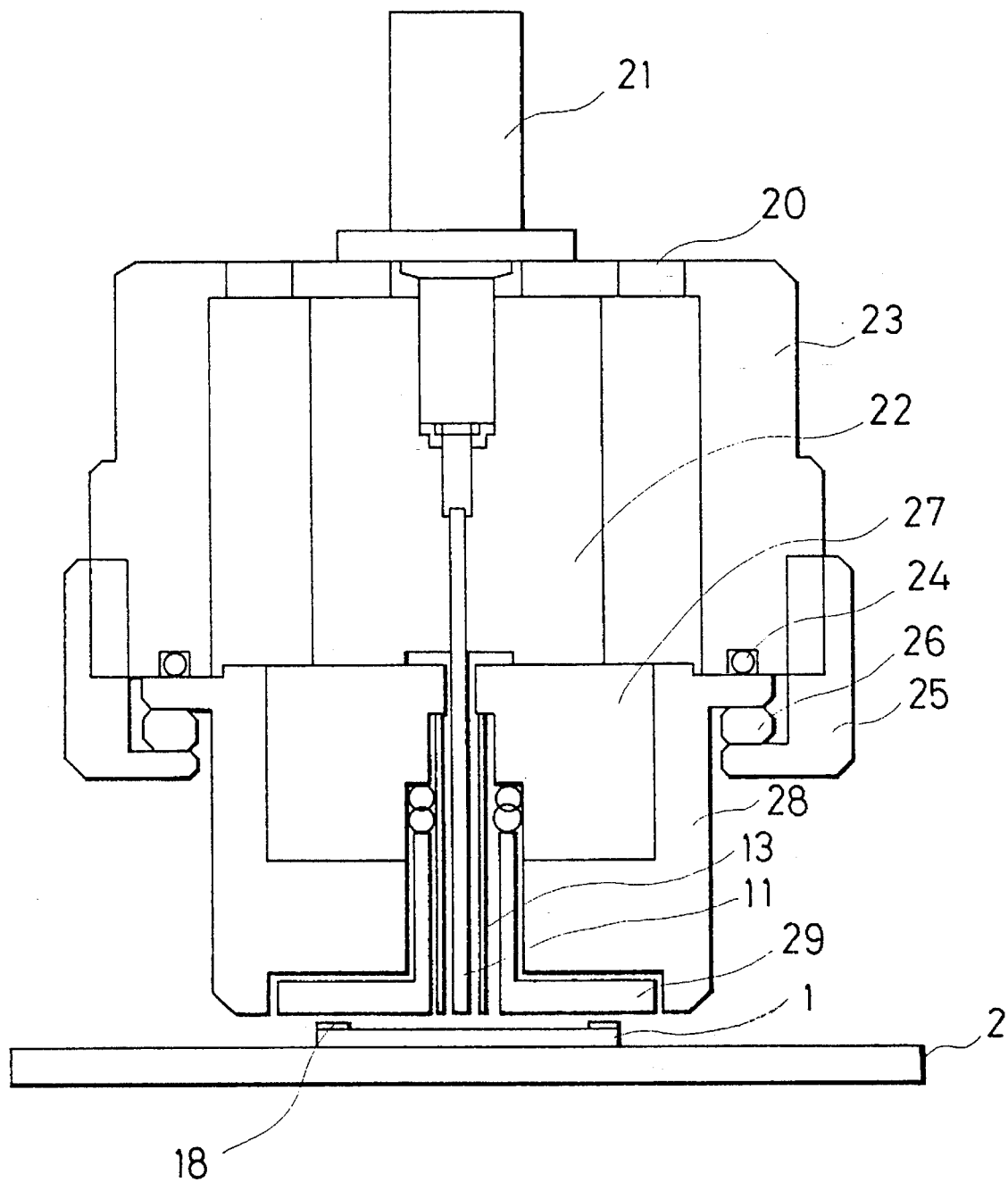
FIG. 2 shows an embodiment of the plasma generating apparatus according to this invention.

FIG. 2 is a cross-sectional view of a plasma generating apparatus of an embodiment of this invention. A coaxial and cylindrical electrode comprises a central conductor 11, a cylindrical insulator 13 and an outside conductor 29. As not clearly illustrated in FIG. 2, the cylindrical insulator 13 is provided in close contact with the outside conductor (outside electrode) 29. In this embodiment, a central conductor 11 is formed of stainless steel, the cylindrical insulator 13 is formed of quartz glass, and the outside conductor 29 is formed of stainless steel. The central conductor 11 is connected to an MHV coaxial connection bolt 21. An alternating electric field is provided from an alternating power source through a coaxial cable (not shown) connected to the MHV coaxial connection bolt to supply electromagnetic energy between the central conductor 11 and the outside conductor 29. Helium mainly-contained gas is supplied from a gas supply port 20 through Teflon insulators 22 and 27 into a gap between the central conductor 11 and the insulator 13. The Teflon insulators 23 and 28 are also used to prevent charging at an undesired place. Frames 23 and 28 are fixed by clamp jigs 25 and 26. The frames 23 and 28 and the clamp jigs 25 and 26 are formed of stainless steel, and kept to the ground potential together with the outside conductor 29.

The apparatus is sealed by an O ring 24 to prevent the supplied helium mainly-contained gas from leaking through a gap between respective parts. In addition, conductive metal foil is filled into a gap between the cylindrical insulator 13 and the outside conductor 29 (not shown).

A (100) surface of a P-type Si substrate is used as an object to be processed 1, and samples having resistance values of 0.01 $\Omega$cm, 0.4 $\Omega$cm, 10 $\Omega$cm, 50 $\Omega$cm and 100 $\Omega$cm respectively are used as the substrate 1. Between these samples, the difference of etching efficiency in accordance with variation of electric resistance of an object to be processed was experimentally measured (experimental result will be described later). The substrate holder 2 is formed of Pyrex glass (1.1 mm thickness).

Figure 3:
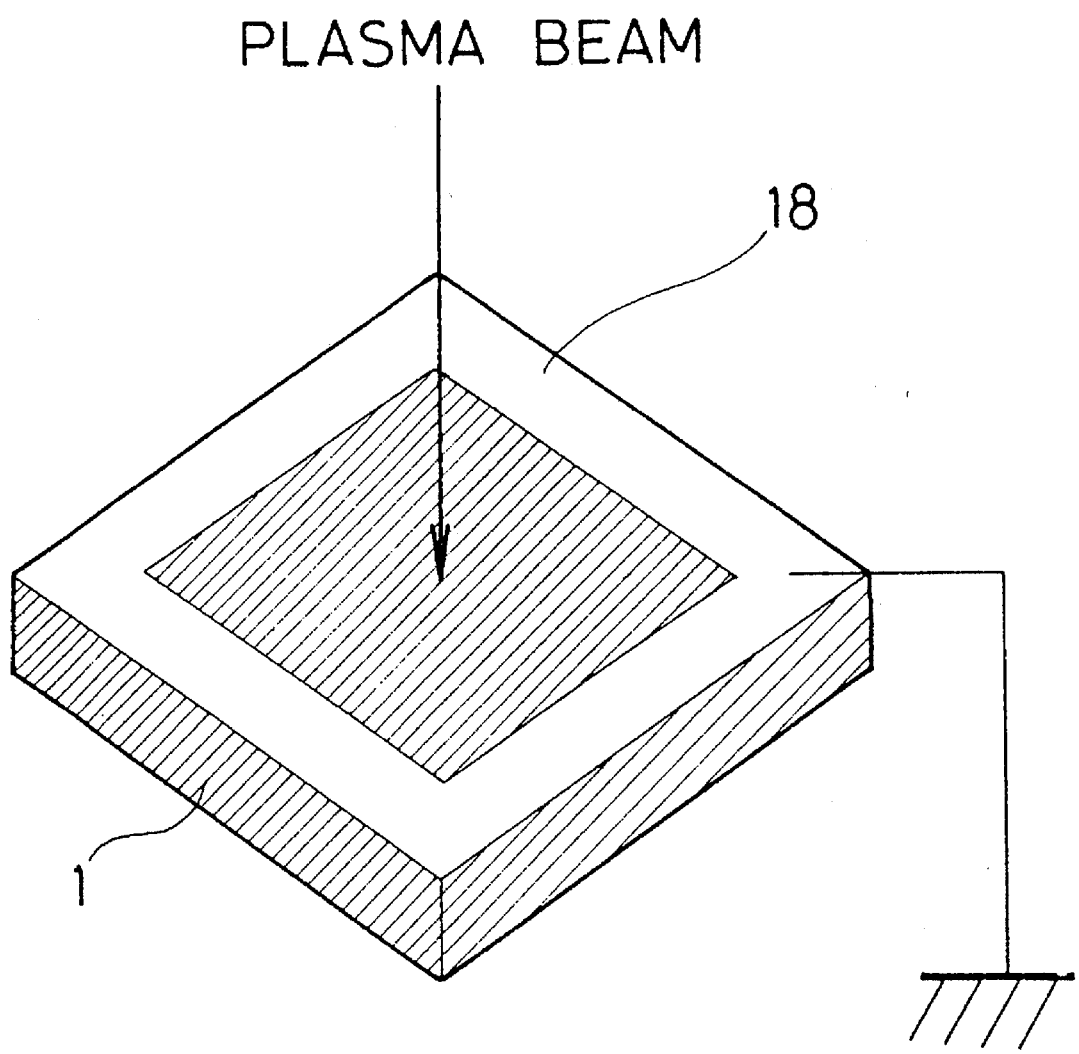
FIG. 3 is a schematic view of the surrounding of an electrode thin film in the apparatus of the embodiment.

A gold thin film is deposited in about 2 mm width at an edge portion of an etching surface side of the substrate 1 to form an electrode thin film 18 serving as a ground electrode. FIG. 3 is a schematic view of the surrounding of the electrode thin film. In FIG. 3, it is illustrated that the grounded electrode thin film 18 is formed at the peripheral portion of the substrate 1 which is to be etched, and plasma beam is irradiated onto the surface to be etched. The grounded electrode thin film 18 serves to prevent the substrate 1 (object to be processed) from being charged by electrons which travel to the substrate 1 together with the plasma beam.

The electrode thin film 18, the housings 23 and 28, the clamp jigs 25 and 26 and the outside conductor 29 are kept to the ground potential. In this embodiment, the electrode thin film 18 is electrically connected to the outside conductor 29 through a contact terminal contacted with the electrode thin film 18 to keep the electrode thin film 18 to the ground potential. The electrode thin film 18 may be so designed that it does not serve as a ground electrode, and it is never connected to any part. However, in this case, the same sufficient effect as the case where the electrode thin film is used as a ground electrode can not be obtained.

The distance between the substrate 1 and the central conductor 11 is set to 2 mm. The diameter of the central conductor, the outer diameter of the insulator and the thickness of the insulator are set to 1 mm, 2.5 mm and 0.4 mm, respectively. The discharge was induced at an area of 1.7 mm diameter.

Figure 4:
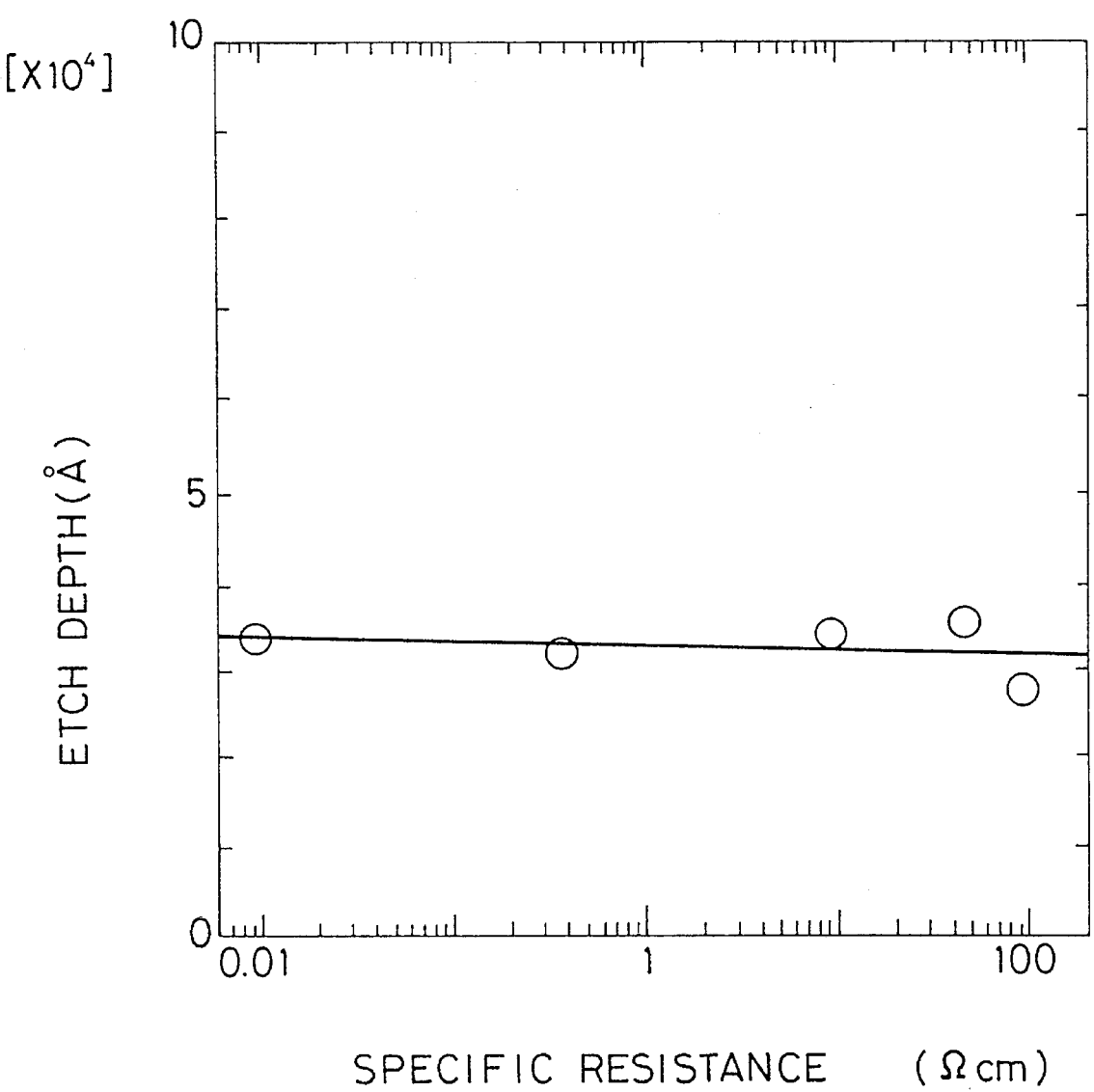
FIG. 4 is a graph showing the relationship between a resistance value of substrate material and an etching depth on the silicon substrate surface by $CF_4$/helium plasma in the presence of an electrode thin film.

In the experiment, when Helium of 99.5 sccm and $CF_4$ of 0.5 sccm were supplied to the plasma generating apparatus thus constructed, and 120 W high-frequency electric power of 13.56 MHz was applied, a stable discharge could be obtained. This discharge was continued for 10 minutes. In this state, an etching treatment was conducted on the above samples having various resistance values for 10 minutes, and the result (relationship between resistance value of a substrate and an etching depth) is shown in FIG. 4. In FIG. 4, the ordinate of the graph represents the etching depth (Angstrom) and the abscissa represents specific resistance of the substrate. As is apparent from the graph of FIG. 4, an uniform etching treatment could be performed irrespective of the resistance of the substrate. Since the etching time was constant, the etching depth of FIG. 4 also represents a relative etching speed The etching speed was very high (0.34 m/min). The plasma temperature was measured to about 100 degrees by a thermocouple. Therefore, it is estimated that the temperature on the surface of the object to be processed was below 100 degrees.

[Comparative Example]

A plasma generating apparatus and an etching condition used in this comparative example were substantially identical to those of the Embodiment 1, except that no electrode thin film 18 was provided. That is, this comparative example was prepared to confirm the effect when the ground electrode was provided at a part of the surface of the object to be processed. The same etching treatment as the Embodiment 1 was conducted to obtain an experimental result.

Figure 5:
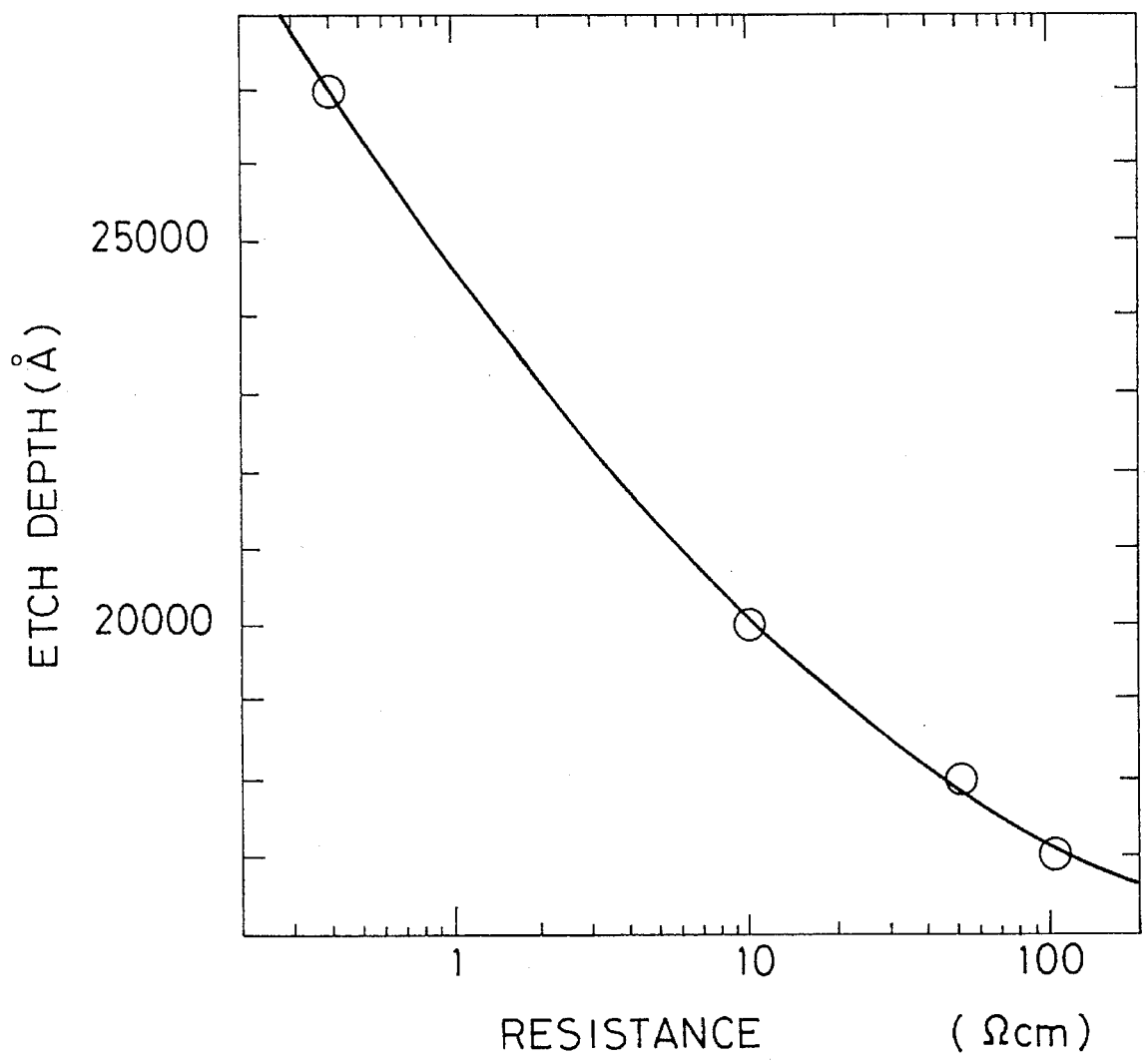
FIG. 5 is a graph showing the relationship between a resistance value of substrate material and an etching depth on the silicon substrate surface by $CF_4$/helium plasma in the absence of an electrode thin film.

FIG. 5 shows a graph showing the relationship between the resistance value of the substrate and the etching depth in this comparative example. As is apparent from FIG. 5, in comparison with the graph of FIG. 4 for the Embodiment 1, the etching speed is rapidly reduced with increase of resistance value.

It is apparent from the result of the comparative example that the etching efficiency is extremely lowered for an object having large electric resistance when no electrode thin film 18 is provided. In addition, it is apparent from the result of the Embodiment 1 that the etching treatment can be performed irrespective of the electric resistance of the object when the electrode thin film 18 is provided to keep the surface of the object (in this case, Si substrate 1) to the ground potential. From these results, it is proved that the etching treatment can be effectively performed .even for an insulator.

[Embodiment 2]

In this embodiment, the etching treatment was tried for a ceramic substrate having an electrode thin film provided on the surface thereof. As an object to be processed was used an alumina substrate of 99.5% in purity. The mount method of the object was the same as the Embodiment 1.

The etching treatment was conducted on the alumina substrate under the same experimental condition as the Embodiment 1. As a result, the etching treatment could be performed at an etching speed of 0.29 m/min because the charging phenomenon was removed by the electrode thin film.

It is apparent from the result of this embodiment that the etching treatment can be conducted on various kinds of insulators by the plasma generating apparatus as shown in FIG. 2 which is used for the Embodiment 1.

[Embodiment 3]

Figure 7:
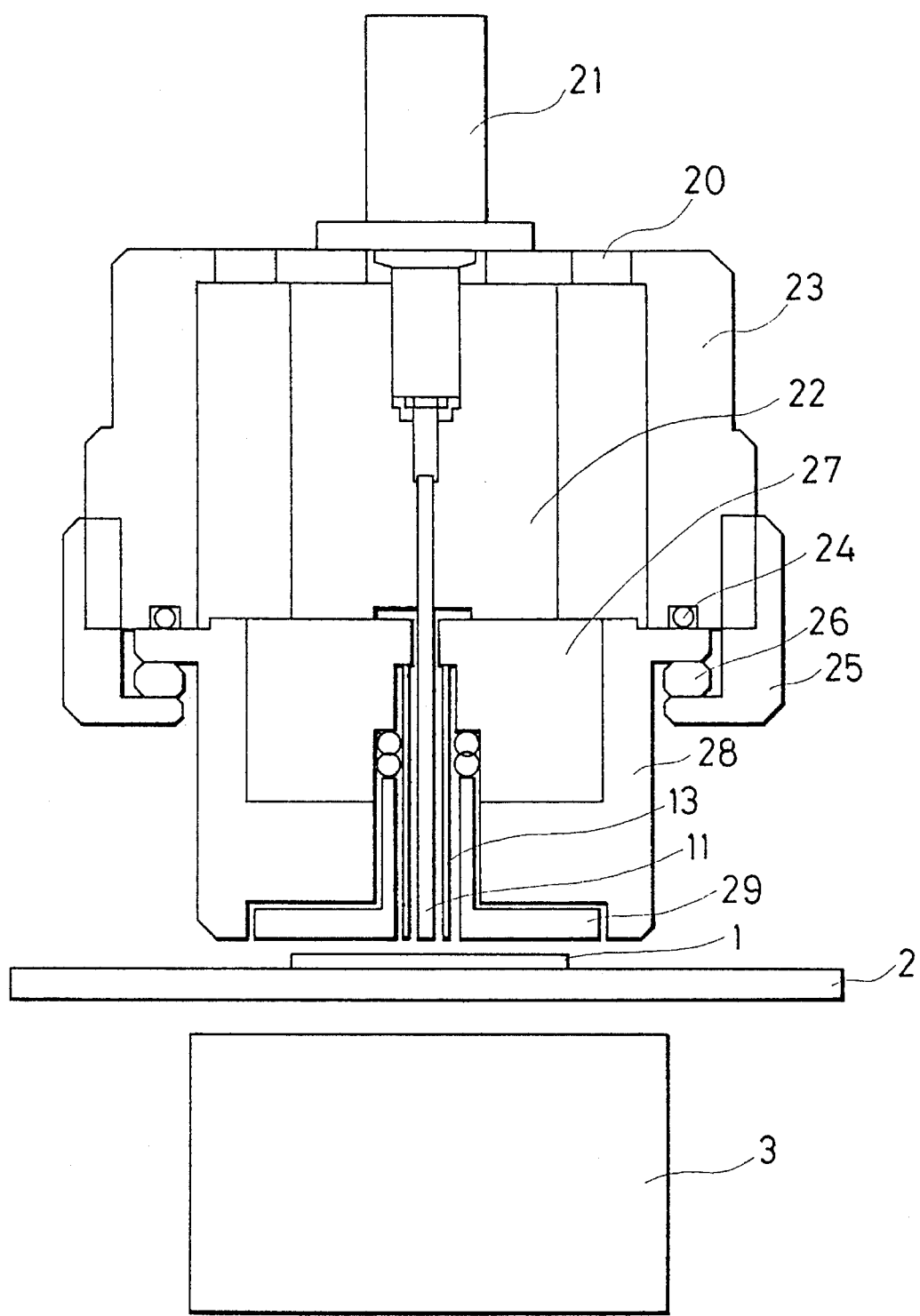
FIG. 7 shows another embodiment of the plasma generating apparatus according to this invention.

FIG. 7 is a cross-sectional view of another embodiment of the plasma generating apparatus according to this invention. The coaxial cylindrical electrode comprises the central conductor 11, the cylindrical insulator 13 and the outside conductor 29. As not clearly shown in FIG. 7, the cylindrical insulator 13 is provided so as to be closely contacted with the outside conductor 29. In this embodiment, the central conductor 11 is formed of stainless steel, the cylindrical insulator 13 is formed of alumina, and the outside conductor 29 is formed of stainless steel. The central conductor 11 is connected to the MHV coaxial connection bolt 21, and an alternating electric field (13.56 MHz) is applied from the alternating power source through the coaxial cable (not shown) connected to the MHV coaxial connection bolt 21. Rare gas is supplied from the gas supply port 20 through the Teflon insulators 22 and 27 into a gap between the central conductor 11 and the cylindrical insulator. The Teflon insulators 22 and 28 are also used to prevent the charging at an undesired place. The frames 23 and 28 constitute the whole body of the apparatus, and fixed by the clamp jigs 25 and 26. The frames 23 and 28 and the clamp jigs 25 and 26 are formed of stainless steel, and kept to the ground potential together with the outside conductor 29. The apparatus is sealed by an O-ring 24 to prevent the supplied rare gas (in this embodiment, argon) from leaking through gaps between the respective parts. The gap between the cylindrical insulator 13 and the outside conductor 29 is filled with conductive metal foil (not shown). The diameter of the central conductor, the outer diameter of the insulator and the thickness of the insulator are set to 1 mm, 2.5 mm and 0.4 mm. The discharge was induced at an area of 1.7 mm diameter.

In FIG. 7, a reference numeral 1 represents a substrate to be etched, a reference numeral 2 represents a substrate holder, and a reference numeral 3 represents a magnet for improving the etching efficiency with magnetic field. A reference numeral 18 represents a grounded electrode which is provided to prevent the substrate from being charged. The electrode 18 is not particularly necessary for this embodiment which attempts to induce low-temperature plasma under atmospheric-pressure with argon. This is because the plasma generating apparatus of this embodiment as shown in FIG. 7 is designed in such a size that it can be mounted on a palm, and thus it can be directly approached to a desired part to conduct the plasma treatment on the part.

With the apparatus thus constructed, argon gas (rare gas) of 100 sccm was supplied to attempt the pure-argon discharge. Upon applying 50 W high-frequency electric power of 13.58 MHz frequency from the power source under a gas-flowing state, a very stable plasma discharge was obtained. Therefore, the pure-argon stable and low-temperature plasma discharge could be succeeded without addition of acetone. The plasma temperature was measured to about several tens degrees (the value was not specified because of fluctuation) by inserting a thermocouple into a plasma generating area, and the plasma thus formed was proved to be a low-temperature plasma.

[Embodiment 4]

This embodiment shows a case where the thickness of the cylindrical insulator is varied.

In this embodiment, a discharge when as the cylindrical insulator material was used a quartz glass tube (0.1 mm thickness) which has been conventionally used will be described. Like the Embodiment 1, argon of 100 sccm was supplied, and 50 W high-frequency electric power of 13.58 MHz frequency was applied to obtain a stable discharge. Similarly in the Embodiment 1, this discharge was continued for 10 minutes, and the stable low-temperature plasma could be obtained with argon. The plasma temperature was measured using a thermocouple like the Embodiment 1, however, it was not specified because the measurements thereof had large fluctuation. However, it was confirmed to be below 100 degrees.

In this embodiment, the low-temperature plasma can be obtained with argon even by thinning the cylindrical insulator.

[Comparative Example]

In this comparative example, the atmospheric-pressure discharge with argon when a cylindrical insulator having low relative dielectric constant was used will be described.

The plasma generating apparatus and the discharge condition of this embodiment were substantially identical to those of the Embodiment 3, except that the quartz glass having the same thickness as the Embodiment 3 was used for the cylindrical insulator. Argon gas was introduced to the plasma generating apparatus thus constructed to attempt the discharge. The discharge was not observed until the supply electric power exceeded about 100 W. From this experiment, it is proved that the discharge condition is greatly varied by altering the dielectric constant of the cylindrical insulator.

[Embodiment 5]

Figure 9:
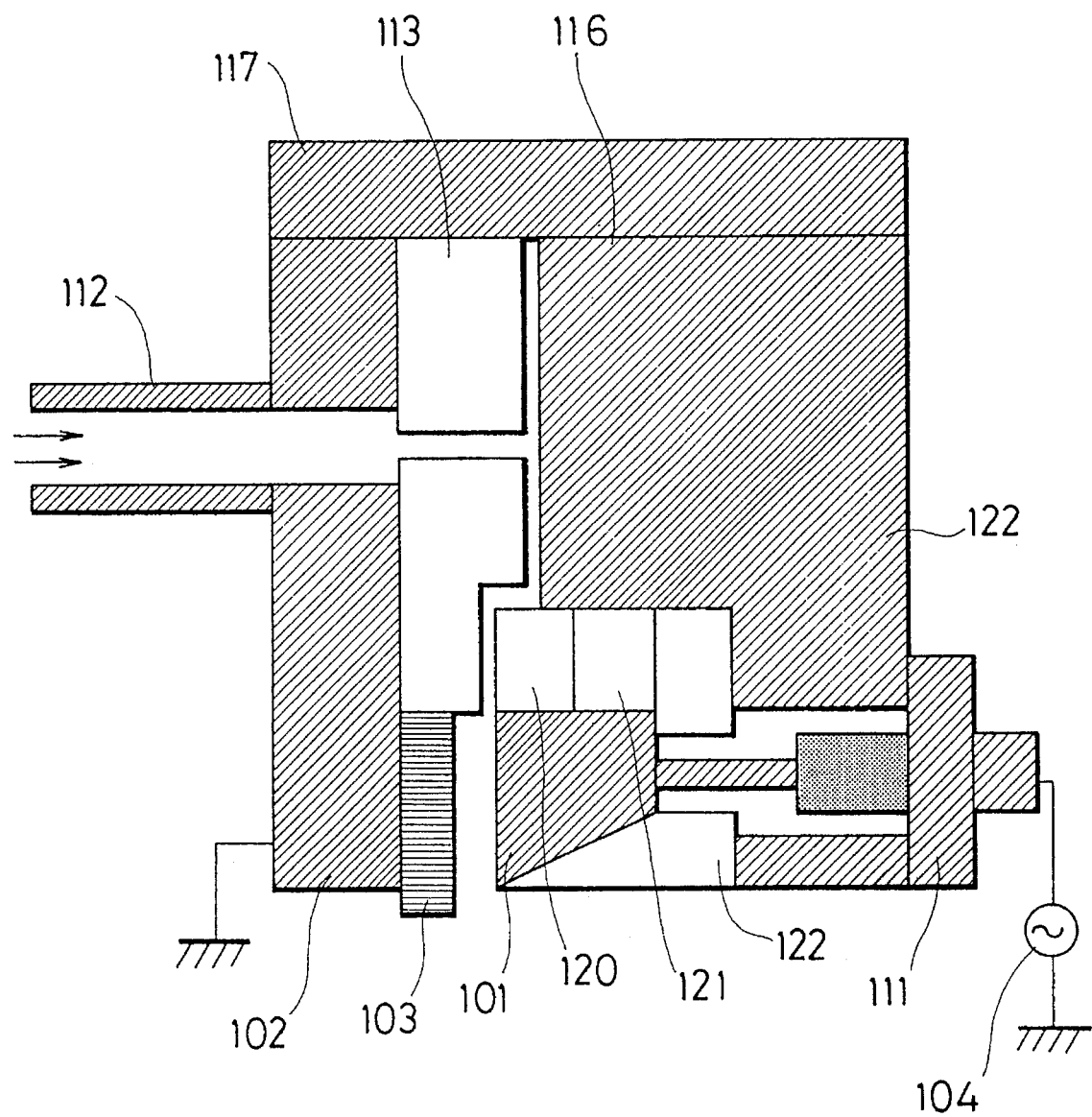
FIG. 9 shows another embodiment of the plasma generating apparatus according to this invention.

FIG. 9 is a cross-sectional view of another embodiment of the plasma generating apparatus according to this invention. A parallel and planar electrode comprises an electrode plate 101, an insulating plate 103 and an outside frame 102. The insulating plate 103 is provided so as to be closely contacted with the outside frame 102. In this embodiment, the electrode plate 101 is formed of stainless steel, the insulating plate 103 is formed of quartz glass and the outside frame 102 is formed of stainless steel. The electrode plate 101 is electrically separated from other elements through three Teflon shields 120, 121 and 122, and connected to an MHV coaxial connection bolt 111. The electrode plate 101 is supplied with alternating electric field from an alternating power source (13.56 MHz) through a coaxial cable (not shown) connected to the MHV coaxial connection bolt 111. Helium to be supplied in gap between the electrode plate 101 and the insulator plate 103 is introduced from a gas supply port 112 through a gas groove engraved in a Teflon insulator 113. The Teflon insulator 113 is also used to prevent the charging at an undesired place. The outside frame 102 and the electrode plate holder 116 are threadably fixed to a roof plate 117. The electrode plate holder 116 and the roof plate are formed of stainless steel, and kept to the ground potential together with the outside frame 102.

The width between the electrode plate and the insulator plate confronting the electrode plate, that is, the width of a discharge portion is set to 8 mm and the thickness of the insulator is set to 1.0 mm. A reference numeral 109 represents a substrate for the etching treatment and the film formation, and a reference numeral 110 represents a substrate holder.

When 100 sccm helium was supplied to the apparatus thus constructed and also 50 W high-frequency electric power having 13.56 MHz frequency was applied, the stable discharge could be induced over the whole area corresponding to the width of the discharge portion. Even when this state was continued for 10 minutes or more, no obstruction such as overheat occurred in the apparatus.

The temperature of plasma formed through the discharge was measured to read about room temperature to 70 degrees by blowing the plasma upon a thermocouple.

[Embodiment 6]

This embodiment shows a case where the discharge is attempted using argon as another rare gas in the plasma generating apparatus of this invention. As described above, the atmospheric-pressure discharging apparatuses, containing the beam-shaped plasma generating apparatus proposed by the inventor of this application, requires raw gas containing 70% or more helium. However, in the plasma generating apparatus of this invention, the stable discharge could be obtained with 70% or less helium or without helium. In this embodiment, in place of helium gas used in the Embodiment 5, argon gas of 100 sccm was supplied to attempt the discharge.

When the discharge was conducted under the same condition as the Embodiment 5, the same stable discharge as the case of helium could be confirmed to be obtained by supplying electric power of 54 W which was slightly higher than that for helium. There was not observed a fine arc discharge which would be observed when high electric power (above 100 W) is supplied in the beam-shaped plasma generating apparatus and argon gas is forcedly discharged, and no overheat trouble occurred.

In the figures, a substrate which is an object to be subjected to a processing or film-formation process using plasma is not illustrated. However, when the plasma obtained in the plasma generating apparatus of this invention is used, the atmospheric-pressure low-temperature plasma generated at the area 105 may be blown upon the substrate. The plasma generating apparatus of this embodiment as shown in FIG. 9 is designed in such a size that it can be mounted on a palm, and thus the apparatus may be approached to the substrate to irradiate the plasma onto the surface of the substrate.

As described above, when the grounded electrode is provided on the surface of the object to be processed, it is proved that the etching treatment can be stably performed using the atmospheric pressure plasma generating apparatus irrespective of the electrical resistance value of the object. In addition, the etching treatment can be effectively carried out using no large-scale vacuum evacuation apparatus.

Further, as described above, it is also proved that by increasing the dielectric constant of the cylindrical insulator of the plasma generating apparatus or reducing the thickness of the cylindrical insulator, the low-temperature discharge under atmospheric pressure using argon gas, which has not been conventionally induced without addition of acetone, can be stably induced using argon alone.

According to the plasma generating apparatus of this invention, low-temperature plasma can be induced under atmospheric pressure with rare gas other than helium gas, and the possibility of an etching treatment with reaction gas containing halogen element can be promoted.

Further, according to the plasma generating apparatus of this invention, the sheet-shaped plasma discharge can be stably induced under atmospheric pressure condition, and thus a treatment apparatus for subjecting the surface of a substrate to the etching or film-forming process over large area can be expected to be implemented.

What is claimed is:

1. A method for plasma processing comprising the step of:
    generating a plasma in an apparatus comprising a pair of electrodes, an insulator provided between said pair of electrodes and in contact with one of said electrodes by applying an alternating electric field between said pair of electrodes with a gas comprising a rare gas flowing between said insulator and the other one of said electrodes,
    wherein said insulator has a ratio (thickness thereof in unit of millimeter)/(relative dielectric constant thereof) of 1 or less.

2. The method of claim 1 wherein said relative dielectric constant is 6.0 or more.

3. The method of claim 1 wherein said thickness is 0.2 millimeter or shorter.

4. The method of claim 1 wherein said gas comprising the rare gas is maintained substantially at an atmospheric pressure.

5. The method of claim 1 wherein said plasma is generate between said insulator and the other one of said electrodes.

6. The method of claim 1 wherein said gas comprising the rare gas is ionized by the application of said alternating electric field.

7. An apparatus for plasma processing comprising:
    an inside electrode and an outside electrode concentrically provided;
    an insulator provided between said inside electrode and said outside electrode and in contact with said outside electrode; and
    means for grounding a surface of a work piece to be processed.

8. The apparatus of claim 7 further comprising a power source for applying an electromagnetic energy to said inside electrode and said outside electrode.

9. The apparatus of claim 7 wherein said insulator has a ratio (thickness thereof in unit of millimeter)/(relative dielectric constant thereof) of 1 or less.

10. An apparatus for plasma processing comprising:

a pair of electrodes provided in parallel with each other;

an insulator provided between said pair of electrodes and in contact with one of said electrodes;

means for making a gas comprising at least one rare gas flow between said insulator and the other one of said electrodes;

means for applying an alternating electric field between said pair of electrodes; and an opening for releasing said gas outside said apparatus in order to effect plasma processing outside said apparatus.

11. The apparatus of claim 10 wherein said gas comprising at least one rare gas is maintained substantially at an atmospheric pressure.

12. The apparatus of claim 10 wherein said gas comprising at least one rare gas can be made to flow in one direction.

13. The apparatus of claim 10 wherein said insulator has a ratio (thickness thereof in unit of millimeter)/(relative dielectric constant thereof) of 1 or less.

14. The method of claim 1 wherein a raw gas is supplied to said plasma.

15. The apparatus of claim 10 wherein a raw gas is supplied to the flow of said rare gas.

* * * * *